United States Patent
Nonomura et al.

(10) Patent No.: US 8,127,391 B2
(45) Date of Patent: Mar. 6, 2012

(54) SUBTRATE TREATMENT APPARATUS

(75) Inventors: Masahiro Nonomura, Kyoto (JP);
Junichi Ishii, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 833 days.

(21) Appl. No.: 12/176,601

(22) Filed: Jul. 21, 2008

(65) Prior Publication Data

US 2009/0025763 A1 Jan. 29, 2009

(30) Foreign Application Priority Data

Jul. 26, 2007 (JP) ................................. 2007-194166

(51) Int. Cl.
*B08B 11/02* (2006.01)
(52) U.S. Cl. ................................. 15/77; 15/88.2; 15/102
(58) Field of Classification Search ............... 15/77, 88.2, 15/102
See application file for complete search history.

(56) References Cited

U.S. PATENT DOCUMENTS

| 6,550,091 B1 | 4/2003 | Radman et al. | |
|---|---|---|---|
| 6,932,884 B2 * | 8/2005 | Saito et al. | 156/345.17 |
| 6,983,755 B2 | 1/2006 | Nam et al. | |
| 7,746,449 B2 * | 6/2010 | Ray et al. | 356/5.01 |
| 2005/0172430 A1 | 8/2005 | Yudovsky et al. | |
| 2006/0076034 A1 | 4/2006 | Nam et al. | |

FOREIGN PATENT DOCUMENTS

| JP | 2-132941 | 11/1990 |
|---|---|---|
| JP | 6-45302 | 2/1994 |
| JP | 11-625 | 1/1999 |
| JP | 2003-19467 | 1/2003 |
| JP | 2003197592 | 7/2003 |
| JP | 2006-278592 | 10/2006 |
| KR | 2003-43235 | 6/2003 |

OTHER PUBLICATIONS

Korean Office Action issued Mar. 16, 2010 in connection with corresponding Korean Patent Application No. 10-2008-0067500.

* cited by examiner

*Primary Examiner* — Randall Chin
(74) *Attorney, Agent, or Firm* — Ostrolenk Faber LLP

(57) ABSTRACT

An inventive substrate treatment apparatus includes a substrate rotation unit which rotates a substrate, a brush to be brought into contact with at least a peripheral edge portion of a front surface of the substrate rotated by the substrate rotation unit, and a peripheral rinse liquid ejection unit which ejects a rinse liquid toward a predetermined rinse liquid applying position on the peripheral edge portion of the front surface of the substrate from a position located radially inward of the predetermined rinse liquid applying position with respect to a rotation radius of the substrate, the predetermined rinse liquid applying position being spaced downstream in a substrate rotation direction from a brush contact area of the peripheral edge portion kept in contact with the brush.

10 Claims, 8 Drawing Sheets

SUBTRATE TREATMENT APPARATUS

BACKGROUND OF THE INVENTION

1. Field of the Invention

The present invention relates to a substrate treatment apparatus for cleaning a substrate. Examples of the substrate to be cleaned include semiconductor wafers, substrates for liquid crystal display devices, substrates for plasma display devices, substrates for FED (Field Emission Display) devices, substrates for optical disks, substrates for magnetic disks, substrates for magneto-optical disks and substrates for photo masks.

2. Description of Related Art

In semiconductor device production processes, contamination of the periphery of a semiconductor wafer (hereinafter referred to simply as "wafer") often significantly influences the treatment quality of the wafer. In a so-called batch treatment process, more specifically, a plurality of wafers are immersed in a vertical orientation in a treatment liquid. Therefore, if contaminants are present on the peripheries of the wafers, the contaminants are liable to be dispersed in the treatment liquid and adhere onto device formation regions of front surfaces of the wafers.

This leads to a recent increasing demand for techniques for cleaning the peripheries of the wafers and other types of substrates.

The following technique is proposed as a prior-art technique for cleaning the periphery of the substrate (see, for example, Japanese Unexamined Patent Publication No. 2006-278592). After the front surface of the substrate is cleaned with a chemical agent for removal of substances (contaminants), the chemical agent and the substances remaining on the front surface of the substrate are washed away by supplying pure water to a center portion of the front surface of the substrate. At this time, a peripheral surface of a cylindrical brush is brought into contact with the periphery of the substrate, whereby substances adhering to the periphery of the substrate are removed.

However, where the front surface of the substrate is hydrophobic (for example, where a low-k film is formed on the front surface of the substrate or where bare silicon is exposed on the front surface of the substrate), the supply of the pure water onto the center portion (device formation region) of the front surface may result in water marks (a trace of water remaining after drying) formed in the device formation region. Further, where copper interconnections or the like are provided on the front surface of the substrate, the supply of the pure water onto the center portion of the front surface of the substrate may result in corrosion of the copper interconnections due to oxidation.

One conceivable approach to this problem is to supply no pure water onto the front surface of the substrate. In this case, however, contaminants scraped from the periphery of the substrate by the brush remains on the periphery and, when the substrate is dried in this state, the contaminants adhere to the substrate.

SUMMARY OF THE INVENTION

It is therefore an object of the present invention to provide a substrate treatment apparatus which is capable of properly removing contaminants from a peripheral edge portion of a front surface of a substrate without adversely affecting a device formation region of the front surface of the substrate.

An inventive substrate treatment apparatus includes a substrate rotation unit which rotates a substrate, a brush to be brought into contact with at least a peripheral edge portion of a front surface of the substrate rotated by the substrate rotation unit, and a peripheral rinse liquid ejection unit which ejects a rinse liquid toward a predetermined rinse liquid applying position on the peripheral edge portion of the front surface of the substrate from a position located radially inward of the predetermined rinse liquid applying position with respect to a rotation radius of the substrate, the predetermined rinse liquid applying position being spaced downstream in a substrate rotation direction from a brush contact area of the peripheral edge portion kept in contact with the brush.

With this arrangement, the brush is brought into contact with at least the peripheral edge portion of the front surface of the substrate rotated by the substrate rotation unit, whereby contaminants adhering to the peripheral edge portion are scraped by the brush. On the other hand, the rinse liquid from the peripheral rinse liquid ejection unit is supplied to the rinse liquid applying position, which is spaced downstream in the substrate rotation direction from the brush contact area, on the peripheral edge portion of the front surface of the substrate. Thus, the contaminants scraped by the brush are immediately washed away by the rinse liquid. This prevents the contaminants scraped by the brush from remaining on and adhering to the peripheral edge portion of the front surface of the substrate.

Since the rinse liquid applying position to which the rinse liquid is supplied is spaced downstream in the substrate rotation direction from the brush contact area, the rinse liquid supplied to the rinse liquid applying position hardly reaches the brush. Thus, the contaminants washed away by the rinse liquid are substantially prevented from adhering to the brush.

The rinse liquid to be supplied to the rinse liquid applying position on the peripheral edge portion of the front surface of the substrate is ejected from the position radially inward of the rinse liquid applying position and, therefore, has a vector directed radially outward with respect to the rotation radius of the substrate. A centrifugal force generated by the rotation of the substrate acts on the supplied rinse liquid. Therefore, the rinse liquid supplied to the peripheral edge portion of the front surface of the substrate is unlikely to flow into a center portion of the front surface. This eliminates the possibility that a device formation region of the front surface of the substrate is adversely affected by the rinse liquid.

As a result, the contaminants can be advantageously removed from the peripheral edge portion of the front surface of the substrate without adversely affecting the device formation region of the front surface of the substrate.

The apparatus may further include a chemical agent supply unit which supplies a chemical agent to the brush. With this arrangement, the chemical agent is supplied to the brush, which is in turn impregnated with the chemical agent and brought into contact with the peripheral edge portion of the front surface of the substrate. With the use of the chemical agent, which has high cleaning power, the contaminants adhering to the peripheral edge portion of the front surface of the substrate can be advantageously removed.

The chemical agent supply unit may be arranged to eject the chemical agent toward a predetermined chemical agent applying position on the peripheral edge portion of the front surface of the substrate from a position located radially inward of the predetermined chemical agent applying position with respect to the rotation radius of the substrate, the predetermined chemical agent applying position being located upstream of the brush contact area of the peripheral edge portion with respect to the substrate rotation direction. With this arrangement, the chemical agent from the chemical agent supply unit is supplied to the chemical agent applying position located upstream of the brush contact area with respect to the substrate rotation direction on the peripheral edge portion of the front surface of the substrate. Thus, the chemical agent supplied to the peripheral edge portion of the front surface of the substrate receives the centrifugal force generated by the rotation of the substrate to be applied to the brush kept in contact with the periphery of the substrate. Therefore, the chemical agent can be properly supplied to the brush.

Further, the chemical agent supplied to the chemical agent applying position from the chemical agent supply unit flows on the peripheral edge portion of the front surface of the substrate to reach the rotating brush. Therefore, scattering of the chemical agent due to the rotation of the brush can be suppressed as compared with a case in which the chemical agent is supplied directly to the brush from the chemical agent supply unit.

Further, the chemical agent to be supplied to the chemical agent applying position on the peripheral edge portion of the front surface of the substrate is ejected from the position radially inward of the chemical agent applying position and, therefore, has a vector directed radially outward with respect to the rotation radius of the substrate. The centrifugal force generated by the rotation of the substrate acts on the supplied chemical agent. Therefore, the chemical agent supplied to the peripheral edge portion of the front surface of the substrate is unlikely to flow into the center portion of the front surface. Accordingly, the chemical agent can be supplied to the brush without adversely affecting the device formation region of the front surface of the substrate.

The substrate rotation unit may be arranged to rotate the substrate about a vertical axis while generally horizontally holding the substrate with the front surface up. In this case, the chemical agent supply unit may be arranged to supply the chemical agent to a back surface of the substrate rotated by the substrate rotation unit. With this arrangement, the chemical agent supplied to the back surface of the substrate receives the centrifugal force generated by the rotation of the substrate, thereby flowing on the back surface of the substrate toward a peripheral edge portion of the back surface. Then, the chemical agent flowing to the peripheral edge portion of the back surface of the substrate reaches the brush kept in contact with the periphery of the substrate. This makes it possible to supply the chemical agent to the brush without supplying the chemical agent to the device formation region of the front surface of the substrate.

The apparatus may further include a chemical agent suction unit which sucks the chemical agent from the brush. With this arrangement, the chemical agent is supplied to the brush from the chemical agent supply unit, while being sucked from the brush by the chemical agent suction unit. Thus, the brush is impregnated with a necessary and sufficient amount of the chemical agent. Therefore, a film of the chemical agent having a proper wet width can be formed on the brush contact area of the peripheral edge portion of the front surface of the substrate.

As a result, it is possible to advantageously clean the peripheral edge portion of the front surface of the substrate, while preventing the chemical agent from adversely affecting the device formation region of the front surface of the substrate.

The apparatus may further include a downstream peripheral chemical agent ejection unit which ejects the chemical agent toward a predetermined chemical agent applying position on the peripheral edge portion of the front surface of the substrate from a position located radially inward of the predetermined chemical agent applying position with respect to the rotation radius of the substrate, the predetermined chemical agent applying position being spaced downstream in the substrate rotation direction from the brush contact area of the peripheral edge portion. With this arrangement, the chemical agent from the downstream peripheral chemical agent ejection unit is supplied to the chemical agent applying position, which is spaced downstream in the substrate rotation direction from the brush contact area, on the peripheral edge portion of the front surface of the substrate. Thus, the contaminants scraped by the brush are immediately washed away by the chemical agent. This prevents the contaminants scraped by the brush from remaining on and adhering to the peripheral edge portion of the front surface of the substrate.

Since the chemical agent applying position to which the chemical agent is supplied is spaced downstream in the substrate rotation direction from the brush contact area of the peripheral edge portion of the front surface of the substrate, the chemical agent supplied to the chemical agent applying position is prevented from directly contacting the brush via the substrate. This prevents the contaminants washed away by the chemical agent from adhering to the brush.

Further, the chemical agent to be supplied to the chemical agent applying position on the peripheral edge portion of the front surface of the substrate is ejected from the position radially inward of the chemical agent applying position and, therefore, has a vector directed radially outward with respect to the rotation radius of the substrate. The centrifugal force generated by the rotation of the substrate acts on the supplied chemical agent. Therefore, the chemical agent supplied to the peripheral edge portion of the front surface of the substrate is unlikely to flow into the center portion of the front surface. This eliminates the possibility that the chemical agent adversely affects the device formation region of the front surface of the substrate.

As a result, the contaminants can be advantageously removed from the peripheral edge portion of the front surface of the substrate without adversely affecting the device formation region of the front surface of the substrate.

The apparatus preferably further includes a gas ejection unit which ejects an inert gas toward the rinse liquid supplied to the peripheral edge portion of the front surface of the substrate from the peripheral rinse liquid ejection unit at a gas applying position from a position located radially inward of the gas applying position with respect to the rotation radius of the substrate, the gas applying position being spaced downstream in the substrate rotation direction from the predetermined rinse liquid applying position. With this arrangement, the inert gas is ejected from the radially inward position to the rinse liquid supplied to the peripheral edge portion of the front surface of the substrate. Therefore, the rinse liquid used for the cleaning is removed from the substrate. Thus, the contaminants can be quickly removed from the peripheral edge portion of the front surface of the substrate. This prevents the contaminants from adhering to the front surface of the substrate after drying of the substrate.

Where the gas ejection unit is provided, the contaminants can be properly removed from the peripheral edge portion of the front surface of the substrate by ejecting a smaller amount of the rinse liquid from the peripheral rinse liquid ejection unit. In this case, a smaller amount of the rinse liquid is supplied to the peripheral edge portion of the front surface of the substrate, so that the rinse liquid scattered from the peripheral edge portion of the substrate is prevented from rebounding onto the front surface of the substrate.

The brush may be made of an elastically deformable material, and have a first cleaning surface having a shape tapered toward one edge thereof in one direction perpendicular to the front surface of the substrate rotated by the substrate rotation unit. Since the first cleaning surface having such a shape is inclined with respect to the perpendicular direction, the brush can be brought into contact with the peripheral edge portion of the front surface of the substrate and a peripheral surface of the substrate. Thus, the peripheral edge portion of the front surface of the substrate and the peripheral surface of the substrate can be simultaneously cleaned.

The brush may further have a second cleaning surface having a shape flared from the one edge of the first cleaning surface in the one perpendicular direction. The second cleaning surface can be brought into contact with the peripheral edge portion of the back surface of the substrate and the peripheral surface of the substrate. Thus, the peripheral edge portion of the back surface of the substrate and the peripheral surface of the substrate can be simultaneously cleaned. Therefore, the peripheral edge portion of the front surface of the substrate and the peripheral surface of the substrate can be simultaneously cleaned by the first cleaning surface, and the peripheral edge portion of the back surface of the substrate and the peripheral surface of the substrate can be simultaneously cleaned by the second cleaning surface. As a result, the periphery of the substrate including the peripheral edge portions of the front and back surfaces and the peripheral surface can be properly cleaned.

The chemical agent may be an ammonia-hydrogen peroxide mixture.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1:
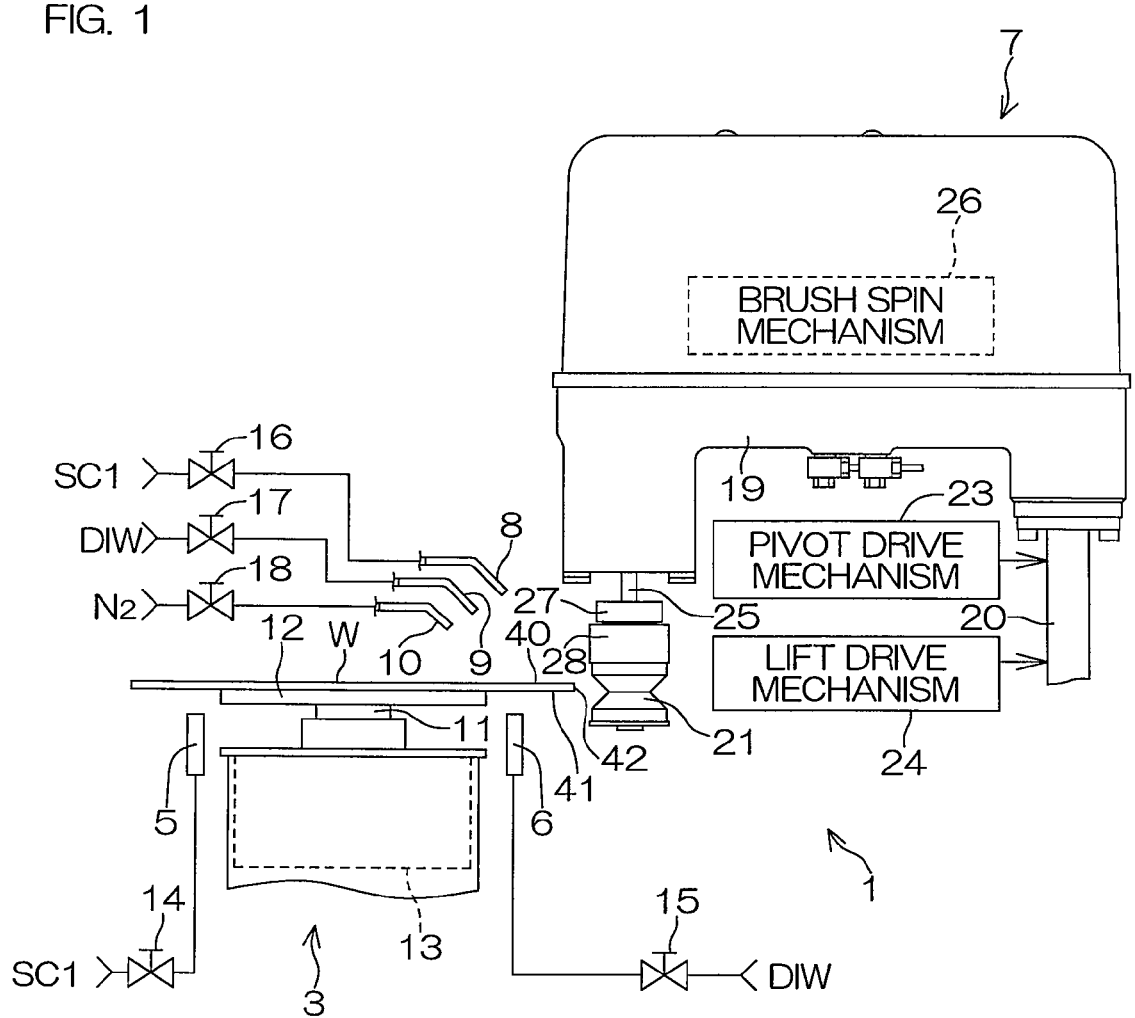
FIG. 1 is a side view schematically showing the construction of a substrate treatment apparatus according to one embodiment (first embodiment) of the present invention.

FIG. 1 is a side view schematically showing the construction of a substrate treatment apparatus 1 according to one embodiment (first embodiment) of the present invention.

The substrate treatment apparatus 1 is of a single substrate treatment type which is adapted to treat a single wafer W (an example of a substrate) at a time. The substrate treatment apparatus 1 includes a spin chuck 3 which generally horizontally holds the wafer W with its front surface (formed with a device) up and rotates the wafer W, a pair of back side SC1 nozzles 5 (only one of which is shown in FIG. 1) for supplying an SC1 (ammonia-hydrogen peroxide mixture) as a chemical agent to a back surface (opposite from the front surface) of the wafer W held by the spin chuck 3, a pair of back side DIW nozzles 6 (only one of which is shown in FIG. 1) for supplying DIW (deionized water) as a rinse liquid to the back surface of the wafer W, a brush mechanism 7 for cleaning the periphery of the wafer W, a first front side SC1 nozzle 8 for supplying the SC1 to a peripheral edge portion 40 of the front surface of the wafer W (not formed with the device), a first front side DIW nozzle 9 for supplying DIW to the peripheral edge portion 40 of the front surface of the wafer W, and an $N_2$ gas nozzle 10 for supplying $N_2$ gas as an inert gas to the peripheral edge portion 40 of the front surface of the wafer W.

The periphery of the wafer W is herein intended to include the peripheral edge portion 40 of the front surface of the wafer W, a peripheral edge portion 41 of the back surface of the wafer W, and a peripheral surface 42 of the wafer W. The peripheral edge portions 40, 41 are herein each defined as an annular region having a width of 1 to 4 mm as measured from a peripheral edge of the wafer W.

The spin chuck 3 is a vacuum suction chuck, and includes a spin shaft 11 extending generally vertically, a suction base 12 provided on an upper end of the spin shaft 11 for generally horizontally holding the wafer W by sucking the back surface of the wafer W, and a spin motor 13 having a rotation shaft coupled coaxially with the spin shaft 11. When the spin motor 13 is driven with the back surface of the wafer W being sucked to be held on the suction base 12, the wafer W is rotated about a center axis of the spin shaft 11.

The SC1 is supplied to the back side SC1 nozzles 5 from an SC1 supply source through a back side SC1 valve 14.

The DIW is supplied to the back side DIW nozzles 6 from a DIW supply source through a back side DIW valve 15.

The SC1 from the SC1 supply source is also supplied to the first front side SC1 nozzle 8 through a first front side SC1 valve 16.

The DIW from the DIW supply source is also supplied to the first front side DIW nozzle 9 through a first front side DIW valve 17.

The $N_2$ gas is supplied to the $N_2$ gas nozzle 10 from an $N_2$ gas supply source through an $N_2$ gas valve 18.

The brush mechanism 7 includes a pivot arm 19 extending generally horizontally above a wafer holding position at which the wafer W is held by the spin chuck 3, an arm support shaft 20 which supports the pivot arm 19, and a brush 21 held by a distal end portion of the pivot arm 19 for cleaning the periphery of the wafer W.

The arm support shaft 20 extends vertically. An upper end of the arm support shaft 20 is connected to a lower surface of an end portion (proximal end portion) of the pivot arm 19. A driving force of a pivot drive mechanism 23 is inputted to the arm support shaft 20. The input of the driving force to the arm support shaft 20 from the pivot drive mechanism 23 reciprocally pivots the arm support shaft 20, whereby the pivot arm 19 is pivoted about the arm support shaft 20. A lift drive mechanism 24 is connected to the arm support shaft 20. The arm support shaft 20 is moved up and down by the lift drive mechanism 24, whereby the pivot arm 19 is moved up and down together with the arm support shaft 20.

A brush spin shaft 25 is rotatably supported by the distal end portion of the pivot arm 19. A brush spin mechanism 26 for rotating the brush spin shaft 25 is connected to the brush spin shaft 25 within the pivot arm 19. On the other hand, a holder attachment portion 27 is fixed to a lower end of the brush spin shaft 25. The brush 21 is attached to the holder attachment portion 27 via a brush holder 28.

Figure 2:
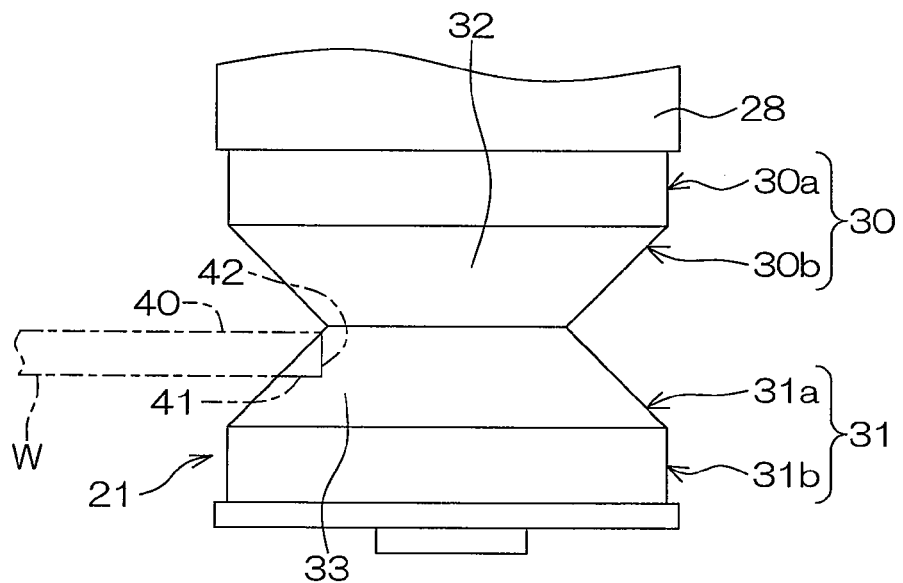
FIG. 2 is a side view showing the structure of a brush shown in FIG. 1.

FIG. 2 is a side view showing the structure of the brush 21.

The brush 21 is made of a sponge material such as PVA (polyvinyl alcohol). The brush 21 includes a first cleaning portion 30 for cleaning the peripheral surface 42 and the peripheral edge portion 40 of the front surface of the wafer W, and a second cleaning portion 31 for cleaning the peripheral surface 42 and the peripheral edge portion 41 of the back surface of the wafer W. The first cleaning portion 30 and the second cleaning portion 31 are integrally provided in vertically stacked relation, and the entire brush 21 has a generally hourglass shape which is rotationally symmetrical about a vertical axis thereof.

The first cleaning portion 30 includes an upper portion 30a having a generally cylindrical shape, and a lower portion 30b having a generally truncated cone shape tapered downward. A side surface of the lower portion 30b of the first cleaning portion 30 has an upper edge continuous to a lower edge of a side surface of the upper portion 30a, and is inclined downward toward its center axis at an inclination angle of 45 degrees with respect to the center axis. The side surface of the lower portion 30b of the first cleaning portion 30 serves as a first cleaning surface 32 which is brought into contact with the peripheral surface 42 and the peripheral edge portion 40 of the front surface of the wafer W.

The second cleaning portion 31 is connected to a lower end of the first cleaning portion 30 to be combined with the first cleaning portion 30 as sharing the center axis with the first cleaning portion 30. The second cleaning portion 31 includes an upper portion 31a having a generally truncated cone shape expanded downward, and a lower portion 30b having a generally cylindrical shape. A side surface of the upper portion 31a of the second cleaning portion 31 has an upper edge continuous to a lower edge of the side surface of the lower portion 30b of the first cleaning portion 30, and is inclined downward away from the center axis at an inclination angle of 45 degrees with respect to the center axis. Further, the side surface of the upper portion 31a has a lower edge continuous to an upper edge of a side surface of the lower portion 31b. The side surface of the upper portion 31a of the second cleaning portion 31 serves as a second cleaning surface 33 which is brought into contact with the peripheral surface 42 and the peripheral edge portion 41 of the back surface of the wafer W.

Figure 3:
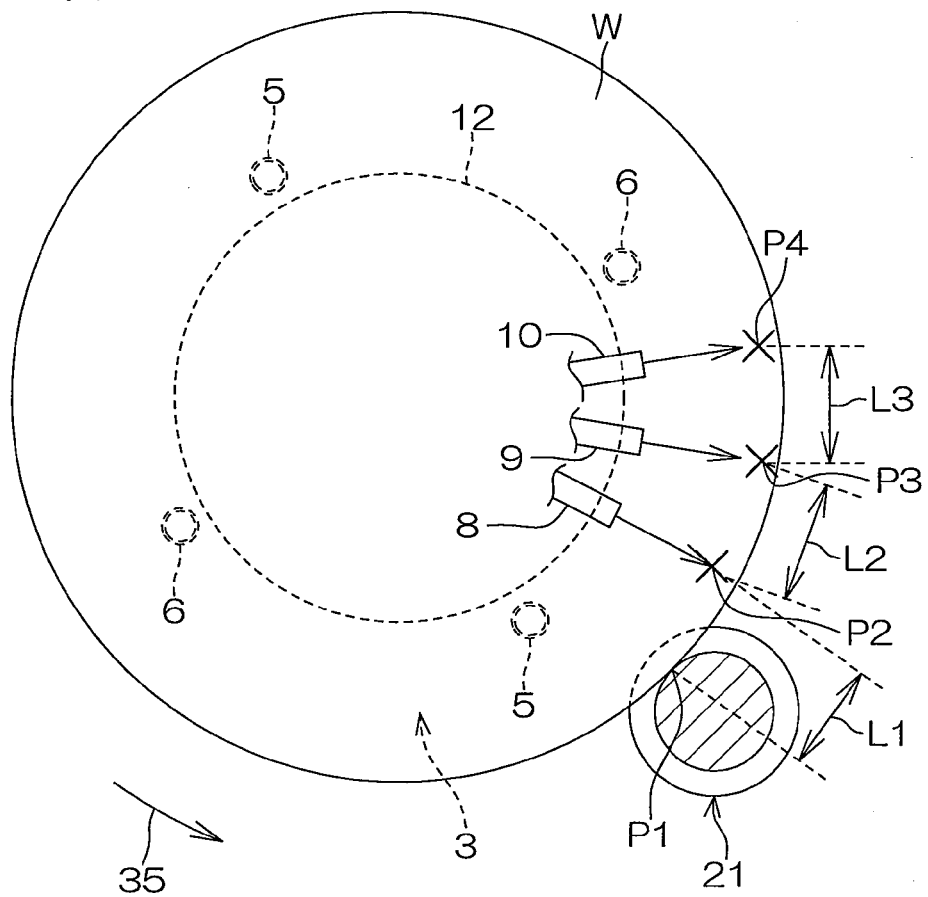
FIG. 3 is a plan view of a wafer held by a spin chuck shown in FIG. 1.

FIG. 3 is a plan view of the wafer W held by the spin chuck 3.

The back side SC1 nozzles 5 are located on a circle centered on the center axis of the spin shaft 11 symmetrically about the center axis as seen in plan. The back side SC1 nozzles 5 each have an outlet port located adjacent the back surface of the wafer W and directed vertically upward.

The back side DIW nozzles 6 are located on the same circle as the back side SC1 nozzles 5 in 90-degree offset relation to the back side SC1 nozzles 5 symmetrically about the center axis as seen in plan. The back side DIW nozzles 6 each have an outlet port located adjacent the back surface of the wafer W and directed vertically upward.

The first front side SC1 nozzle 8 has an outlet port directed toward an SC1 applying position P2 on the peripheral edge portion 40 of the front surface of the wafer W, and is disposed radially inward of the SC1 applying position P2 with respect to the rotation radius of the wafer W above the spin chuck 3. Thus, the SC1 ejected from the first front side SC1 nozzle 8 is directed radially outward from a radially inward side along the rotation radius of the wafer W as seen in plan. The SC1 applying position P2 is spaced a distance L1 downstream in a wafer rotation direction (indicated by an arrow 35) from a brush contact position P1 at which the brush 21 contacts the periphery of the wafer W. The distance L1 is, for example, about one tenth the diameter of the wafer W.

The first front side DIW nozzle 9 has an outlet port directed toward a DIW applying position P3 on the peripheral edge portion 40 of the front surface of the wafer W, and is disposed radially inward of the DIW applying position P3 with respect to the rotation radius of the wafer W above the spin chuck 3. Thus, the DIW ejected from the first front side DIW nozzle 9 is directed radially outward from a radially inward side along the rotation radius of the wafer W as seen in plan. The DIW applying position P3 is spaced a distance L2 downstream in the wafer rotation direction from the SC1 applying position P2. The distance L2 is, for example, about one tenth the diameter of the wafer W.

The $N_2$ gas nozzle 10 has an outlet port directed toward an $N_2$ gas applying position P4 on the peripheral edge portion 40 of the front surface of the wafer W, and is disposed radially inward of the $N_2$ gas applying position P4 with respect to the rotation radius of the wafer W above the spin chuck 3. Thus, the $N_2$ gas ejected from the $N_2$ gas nozzle 10 is directed radially outward from a radially inward side along the rotation radius of the wafer W as seen in plan. The $N_2$ gas applying position P4 is spaced a distance L3 downstream in the wafer rotation direction from the DIW applying position P3. The distance L3 is, for example, about one tenth the diameter of the wafer W.

Figure 4:
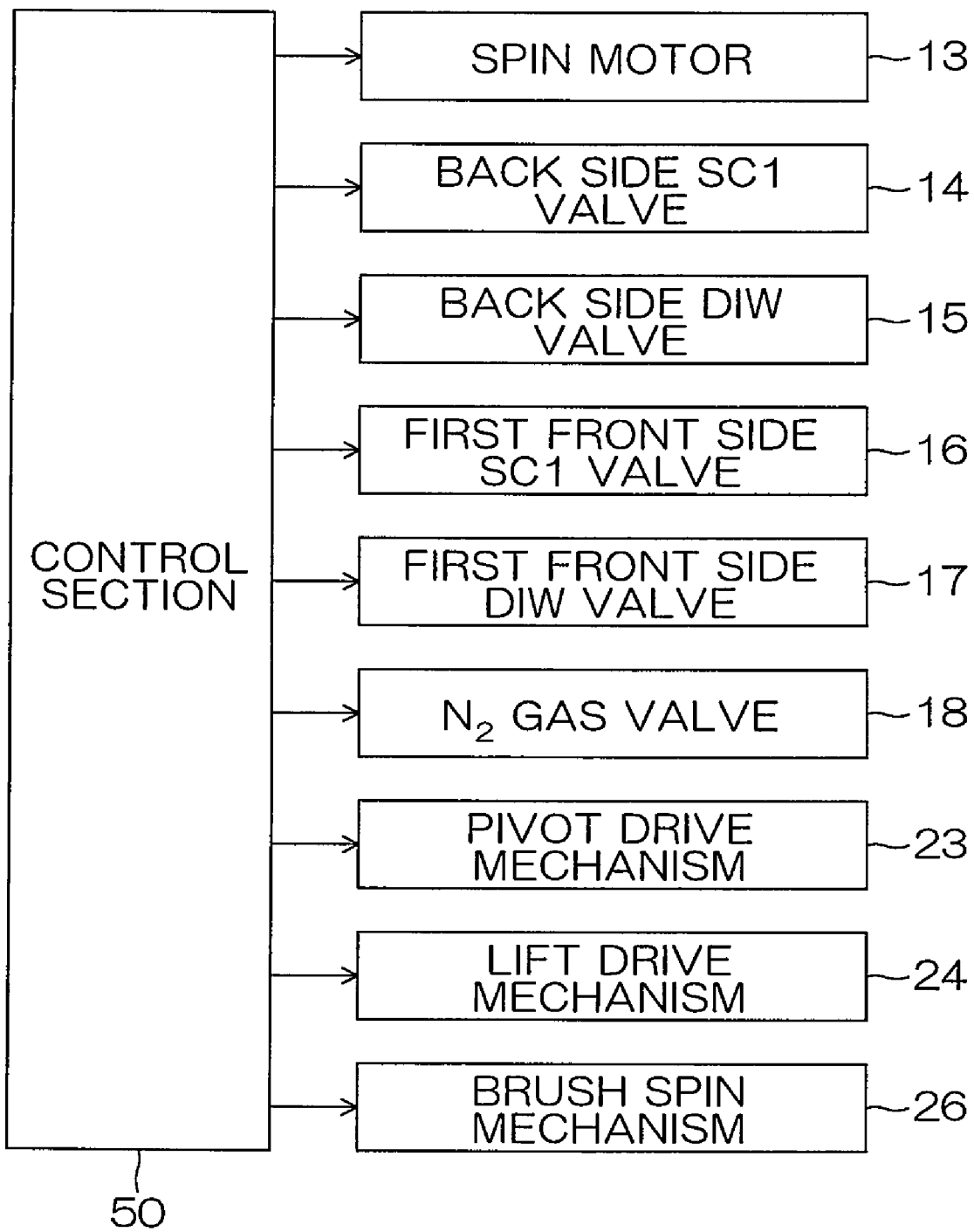
FIG. 4 is a block diagram for explaining the electrical construction of the substrate treatment apparatus shown in FIG. 1.

FIG. 4 is a block diagram for explaining the electrical construction of the substrate treatment apparatus 1.

The substrate treatment apparatus 1 includes a control section 50 including a microcomputer.

The spin motor 13, the back side SC1 valve 14, the back side DIW valve 15, the first front side SC1 valve 16, the first front side DIW valve 17, the $N_2$ gas valve 18, the pivot drive mechanism 23, the lift drive mechanism 24 and the brush spin mechanism 26 are connected as control objects to the control section 50.

Figure 5:
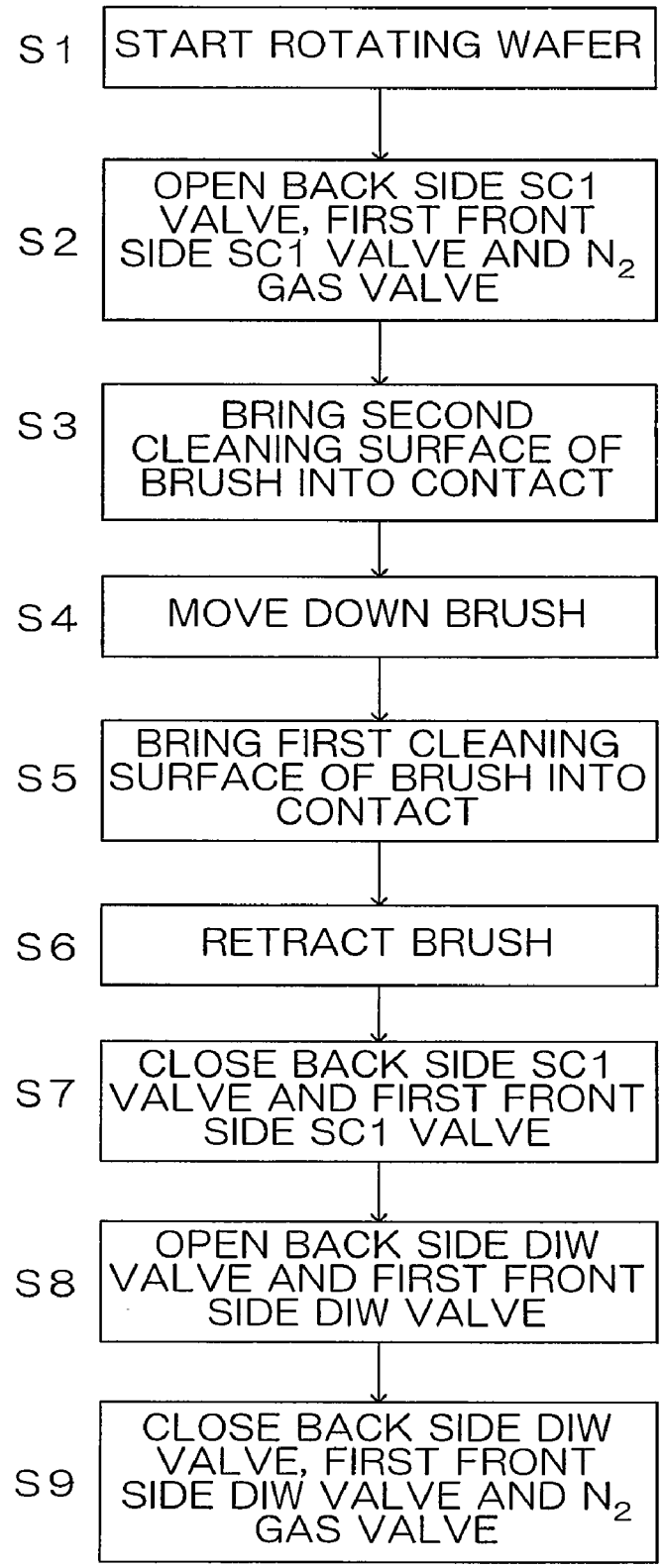
FIG. 5 is a process diagram for explaining a wafer treatment process to be performed by the substrate treatment apparatus shown in FIG. 1.

FIG. 5 is a process diagram for explaining a wafer treatment process to be performed by the substrate treatment apparatus 1. A process for cleaning a wafer W having a low-k film (hydrophobic film) formed on the center portion (device formation region) of the front surface thereof will hereinafter be described by way of example.

The wafer W is transported into the substrate treatment apparatus 1, and then held on the spin chuck 3 with its front surface up.

After the wafer W is held on the spin chuck 3, the control section 50 controls the spin motor 13 to cause the spin chuck 3 to start rotating the wafer W (Step S1). The wafer W is rotated in the direction indicated by the arrow 35, for example, at a rotation speed of 100 rpm.

In turn, the control section 50 opens the back side SC1 valve 14 to start supplying the SC1 onto the back surface of the wafer W from the pair of back side SC1 nozzles 5 (Step S2). The SC1 is ejected, for example, at a flow rate of 20 mL/min from the pair of back side SC1 nozzles 5. The SC1 supplied onto the back surface of the wafer W receives a centrifugal force generated by the rotation of the wafer W to flow on the back surface of the wafer W toward the peripheral edge portion 41 of the back surface of the wafer W.

Further, the control section 50 opens the first front side SC1 valve 16 to eject the SC1 from the first front side SC1 nozzle 8 toward the SC1 applying position P2 on the peripheral edge portion 40 of the front surface of the wafer W (Step S2). The SC1 to be supplied to the peripheral edge portion 40 of the front surface of the wafer W has a vector directed radially outward from the radially inward side along the rotation radius of the wafer W as seen in plan. The SC1 is ejected, for example, at a flow rate of 10 mL/min from the first front side SC1 nozzle 8. The flow rate of the SC1 is thus set at a relatively low level in order to prevent the SC1 scattered from the front surface of the wafer W from rebounding against a member disposed around the spin chuck 3 (e.g., a treatment cup (not shown) which accommodates the spin chuck 3) and adhering to the center portion of the front surface of the wafer W.

Further, the control section 50 opens the $N_2$ gas valve 18 to eject the $N_2$ gas from the $N_2$ gas nozzle 10 toward the $N_2$ gas applying position P4 on the peripheral edge portion 40 of the front surface of the wafer W (Step S2). The $N_2$ gas is ejected, for example, at a flow rate of 5 L/min from the $N_2$ gas nozzle 10.

Then, the control section 50 controls the brush spin mechanism 26 to rotate the brush 21, for example, at a rotation speed of 100 to 200 rpm in the same direction as the wafer rotation direction. Thereafter, the control section 50 controls the pivot drive mechanism 23 and the lift drive mechanism 24 to bring the second cleaning surface 33 of the brush 21 into contact with the peripheral surface 42 and the peripheral edge portion 41 of the back surface of the wafer W (Step S3). More specifically, the control section 50 first controls the lift drive mechanism 24 to move the brush 21 to a predetermined height position to bring the second cleaning surface 33 of the brush 21 into opposed relation to the peripheral surface 42 of the wafer W. Then, the control section 50 controls the pivot drive mechanism 23 to pivot the pivot arm 19, whereby the brush 21 is horizontally moved. Thus, the wafer W squeezes into the second cleaning surface 33 of the brush 21, so that the second cleaning surface 33 of the brush 21 is depressed by the peripheral surface 42 and the peripheral edge portion 41 of the back surface of the wafer W. In this state, the brush 21 is supplied with the SC1 flowing to the peripheral edge portion 41 of the back surface of the wafer W. Then, the peripheral surface 42 and the peripheral edge portion 41 of the back surface of the wafer W are cleaned by the brush 21 supplied with the SC1.

After a lapse of a predetermined period from time at which the second cleaning surface 33 of the brush 21 is brought into contact with the wafer W, the control section 50 controls the lift drive mechanism 24 to move down the brush 21 to a predetermined height level (Step S4). Thus, the second cleaning surface 33 of the brush 21 is brought out of contact with the wafer W, and the periphery of the wafer W is brought into contact with the first cleaning surface 32 of the brush 21. Thus, the wafer W squeezes into the first cleaning surface 32 of the brush 21 (Step S5: contact with the first cleaning surface of the brush), so that the first cleaning surface 32 is depressed by the peripheral surface 42 and the peripheral edge portion 40 of the front surface of the wafer W. In this state, the supply of the SC1 to the back surface of the wafer W is continued, so that the brush 21 is supplied with the SC1 flowing on the back surface of the wafer W to the peripheral surface 42 of the wafer W. Thus, the peripheral surface 42 and the peripheral edge portion 40 of the front surface of the wafer W are cleaned by the brush 21 supplied with the SC1.

The SC1 from the first front side SC1 nozzle 8 is supplied to the SC1 applying position P2 located downstream of the brush contact position P1 with respect to the wafer rotation direction. Contaminants scraped from the wafer W by the brush 21 are washed away by the SC1 supplied from the first front side SC1 nozzle 8. Since the SC1 is supplied downstream of the brush contact position P1 with respect to the wafer rotation direction, the contaminants scraped from the peripheral edge portion 40 of the front surface of the wafer W are immediately washed away by the SC1.

The SC1 supplied to the peripheral edge portion 40 of the front surface of the wafer W receives the centrifugal force generated by the rotation of the wafer W to flow radially outward with respect to the rotation radius of the wafer W. Since the SC1 applying position P2 is spaced the distance L1 from the brush contact position P1, there is no possibility that the SC1 used for the cleaning directly contacts the brush 21 via the wafer W.

Further, the $N_2$ gas is ejected toward the SC1 supplied to the peripheral edge portion 40 of the front surface of the wafer W from the $N_2$ gas nozzle 10 located on a radially inward side with respect to the rotation radius of the wafer W. Thus, the SC1 is forced radially outward with respect to the rotation radius of the wafer W to be thereby quickly removed from the peripheral edge portion 40 of the front surface of the wafer W without remaining on the peripheral edge portion 40.

After a lapse of a predetermined period from time at which the first cleaning surface 32 of the brush 21 is brought into contact with the wafer W, the control section 50 controls the pivot drive mechanism 23 and the lift drive mechanism 24 to retract the brush 21 to a home position at which the brush 21 is located before the start of the treatment process (Step S6). When the brush 21 is returned to the home position, the control section 50 controls the brush spin mechanism 26 to stop the rotation of the brush 21. Further, the control section 50 closes the back side SC1 valve 14 and the first front side SC1 valve 16 to stop the supply of the SC1 from the back side SC1 nozzles 5 and the first front side SC1 nozzle 8 (step S7).

Thereafter, the control section 50 opens the back side DIW valve 15 to supply the DIW to the center portion of the back surface of the wafer W (Step S8). Thus, the SC1 adhering to the back surface of the wafer W is washed away. Further, the control section 50 opens the first front side DIW valve 17. Thus, the SC1 adhering to the peripheral edge portion 40 of the front surface of the wafer W is washed away.

At this time, the $N_2$ gas is continuously supplied to the peripheral edge portion 40 of the front surface of the wafer W from the $N_2$ gas nozzle 10. This prevents the DIW from flowing to the center portion of the front surface.

After a lapse of a predetermined period from the opening of the back side DIW valve 15 and the first front side DIW valve 17, the control section 50 closes the back side DIW valve 15 and the first front side DIW valve 17 to stop the supply of the DIW from the back side DIW nozzles 6 and the supply of the DIW from the first front side DIW valve 9 (Step S9). Further, the control section 50 closes the $N_2$ gas valve 18 to stop the supply of the $N_2$ gas from the $N_2$ gas nozzle 10 (Step S9).

Thereafter, the control section 50 controls the spin motor 13 to rotate the wafer W at a high speed (e.g., 3000 rpm). Thus, the DIW adhering to the wafer W is spun off, whereby the wafer W is dried. After the high speed rotation of the wafer W is continued for a predetermined period, the rotation of the wafer W by the spin chuck 3 is stopped. After the wafer W comes to standstill, the cleaned wafer W is transported out of the substrate treatment apparatus 1.

According to this embodiment, as described above, the brush 21 is brought into contact with the peripheral edge portion 40 of the front surface of the wafer W rotated by the spin chuck 3, whereby the contaminants are scraped from the peripheral edge portion 40. On the other hand, the SC1 from the first front side SC1 nozzle 8 is supplied to the SC1 applying position P2 spaced the distance L1 downstream in the wafer rotation direction from the brush contact position P1 on the peripheral edge portion 40 of the front surface of the wafer W. Thus, the contaminants scraped by the brush 21 are immediately washed away by the SC1. Therefore, the contaminants scraped by the brush 21 are prevented from remaining on and adhering to the peripheral edge portion 40 of the front surface of the wafer W.

Since the SC1 applying position P2 is spaced the distance L1 downstream in the wafer rotation direction from the brush contact position P1, the SC1 supplied to the SC1 applying position P2 is prevented from directly contacting the brush 21 via the wafer W. Thus, the contaminants washed away by the SC1 are prevented from adhering to the brush 21.

Further, the SC1 to be supplied to the SC1 applying position P2 on the peripheral edge portion 40 of the front surface of the wafer W is ejected from the position located radially inward of the SC1 applying position P2 with respect to the rotation radius of the wafer W and, therefore, has a vector directed radially outward with respect to the rotation radius of the wafer W. The centrifugal force generated by the rotation of the wafer W acts on the supplied SC1. Therefore, the SC1 supplied to the peripheral edge portion 40 of the front surface of the wafer W is unlikely to flow into the center portion of the front surface of the wafer W. This eliminates the possibility that the device formation region of the front surface of the wafer W is adversely affected by the SC1.

As a result, the contaminants can be advantageously removed from the peripheral edge portion 40 of the front surface of the wafer W without adversely affecting the device formation region of the front surface of the wafer W.

Figure 6:
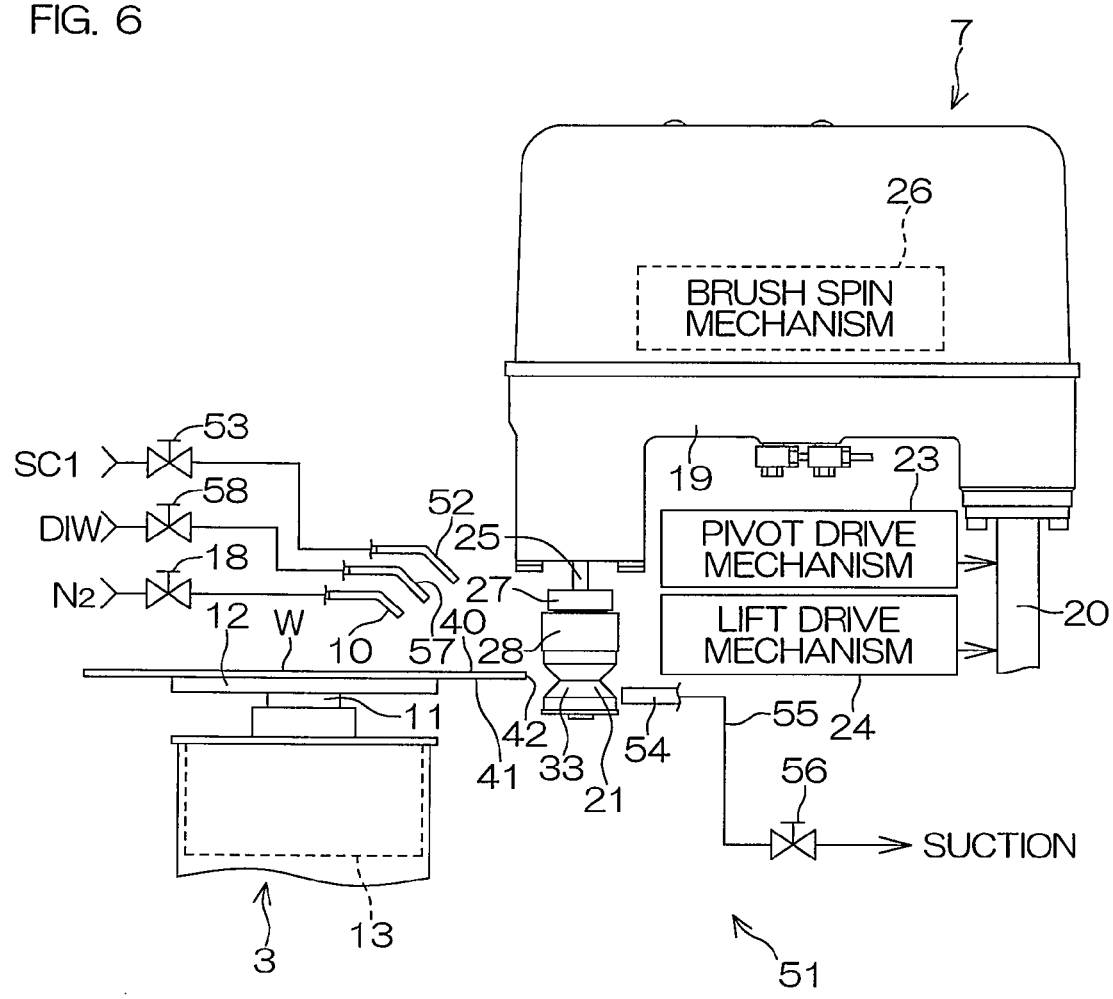
FIG. 6 is a side view schematically showing the construction of a substrate treatment apparatus according to a second embodiment of the present invention.

FIG. 6 is a side view schematically showing the construction of a substrate treatment apparatus 51 according to another embodiment (second embodiment) of the present invention. In the second embodiment, components corresponding to those described in the embodiment (first embodiment) shown in FIGS. 1 to 5 will be denoted by the same reference characters as in FIGS. 1 to 5, and will not be explained unless otherwise requiring particular explanation.

Although the supply of the SC1 to the brush 21 is achieved by supplying the SC1 from the back side SC1 nozzles 5 to the back surface of the wafer W in the first embodiment, the SC1 ejected to the peripheral edge portion 40 of the front surface of the wafer W is supplied to the brush 21 in the second embodiment. Further, the back side SC1 nozzles 5 and the back side DIW nozzles 6 are not provided in the second embodiment.

The substrate treatment apparatus 51 includes a second front side SC1 nozzle 52 for supplying the SC1 to the peripheral edge portion 40 of the front surface of the wafer W, and a second front side DIW nozzle 57 for supplying the DIW to the peripheral edge portion 40 of the front surface of the wafer W.

The SC1 is supplied to the second front side SC1 nozzle 52 from the SC1 supply source not shown through a second front side SC1 valve 53.

The DIW is supplied to the second front side DIW nozzle 57 from the DIW supply source not shown through a second front side DIW valve 58.

The substrate treatment apparatus 51 further includes a suction nozzle 54 for sucking the SC1 from the brush 21. The suction nozzle 54 is connected to one end of a suction pipe 55. The other end of the suction pipe 55 is connected to a suction device (not shown) which evacuates the suction pipe 55 by vacuum. A suction valve 56 is provided in the suction pipe 55 for permitting and prohibiting the suction through the suction nozzle 54. The suction nozzle 54 is arranged to be moved up and down together with the brush 21 by an attachment (not shown) attached to the brush holder 28.

Figure 7:
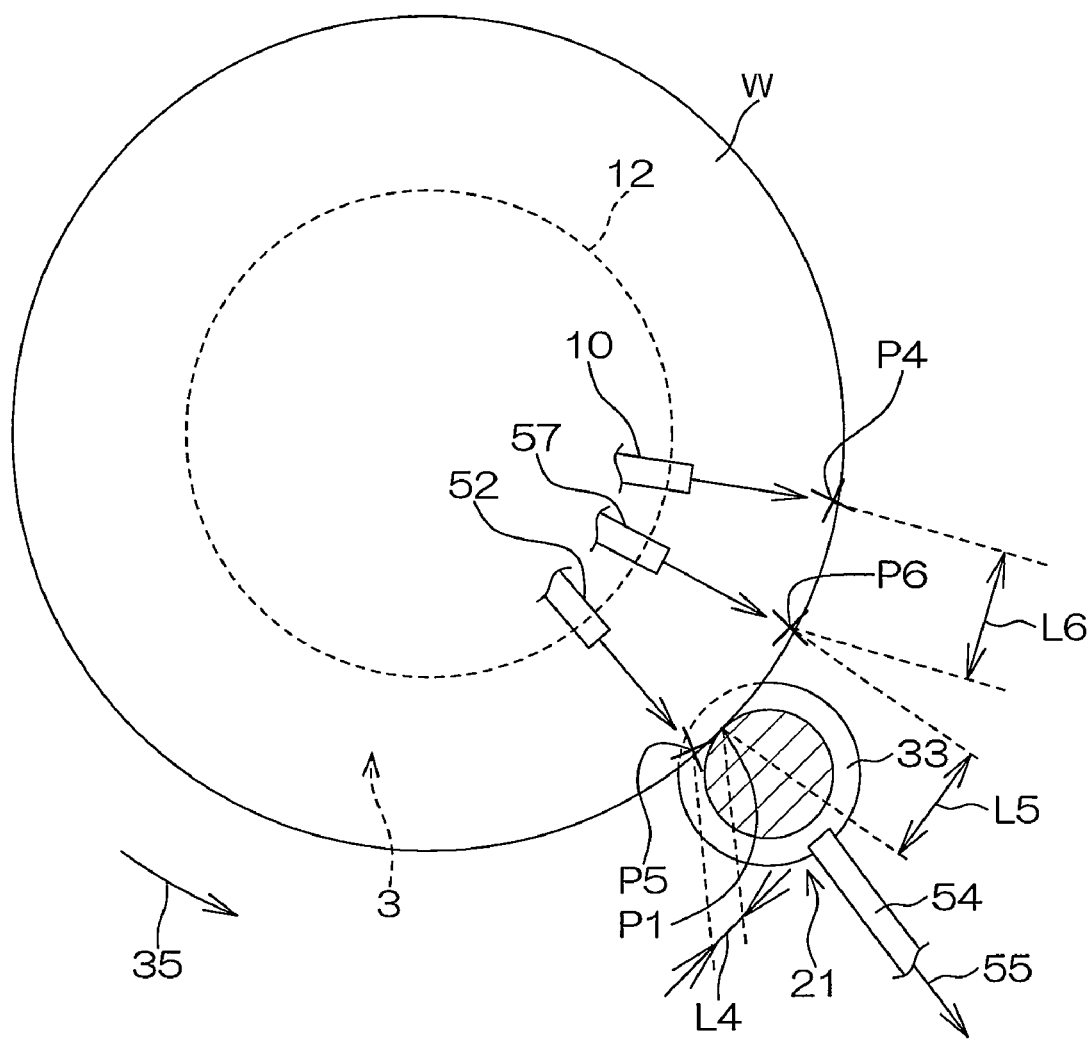
FIG. 7 is a plan view of a wafer held by a spin chuck shown in FIG. 6.

FIG. 7 is a plan view of the wafer held by the spin chuck 3 shown in FIG. 6.

The second front side SC1 nozzle 52 has an outlet port directed toward an SC1 applying position P5 on the peripheral edge portion 40 of the front surface of the wafer W, and is disposed radially inward of the SC1 applying position P5 with respect to the rotation radius of the wafer W above the spin chuck 3. Thus, the SC1 ejected from the outlet port of the second front side SC1 nozzle 52 flows radially outward from a radially inward side along the rotation radius of the wafer W as seen in plan. The SC1 applying position P5 is spaced a distance L4 upstream in the wafer rotation direction (indicated by the arrow 35) from the brush contact position P1 at which the brush 21 contacts the periphery of the wafer W. The distance L4 is, for example, about one thirtieth the diameter of the wafer W.

The second front side DIW nozzle 57 has an outlet port directed toward a DIW applying position P6 on the peripheral edge portion 40 of the front surface of the wafer W, and is disposed radially inward of the DIW applying position P6 with respect to the rotation radius of the wafer W above the spin chuck 3. Thus, the DIW ejected from the second front side DIW nozzle 57 flows radially outward from a radially inward side along the rotation radius of the wafer W as seen in plan. The DIW applying position P6 is spaced a distance L5 downstream in the wafer rotation direction from the brush contact position P1 at which the brush 21 contacts the periphery of the wafer W. The distance L5 is, for example, about one tenth the diameter of the wafer W.

In the second embodiment, the $N_2$ gas applying position P4 to which the $N_2$ gas is ejected from the $N_2$ gas nozzle 10 is spaced a distance L6 downstream in the wafer rotation direction from the DIW applying position P6. The distance L6 is, for example, about one tenth the diameter of the wafer W.

The suction nozzle 54 has a suction port spaced a very small distance (e.g., 3 mm) from the peripheral surface (e.g., the second cleaning surface 33 in FIGS. 6 and 7) of the brush 21. Therefore, when the suction pipe 55 is evacuated by the suction device (not shown) by opening the suction valve 56 with the brush 21 being impregnated with the SC1, the SC1 is sucked from the brush 21 through the suction nozzle 54. Thus, the SC1 is sucked from the brush 21 through the suction nozzle 54 without interference with the rotation of the brush 21.

Figure 8:
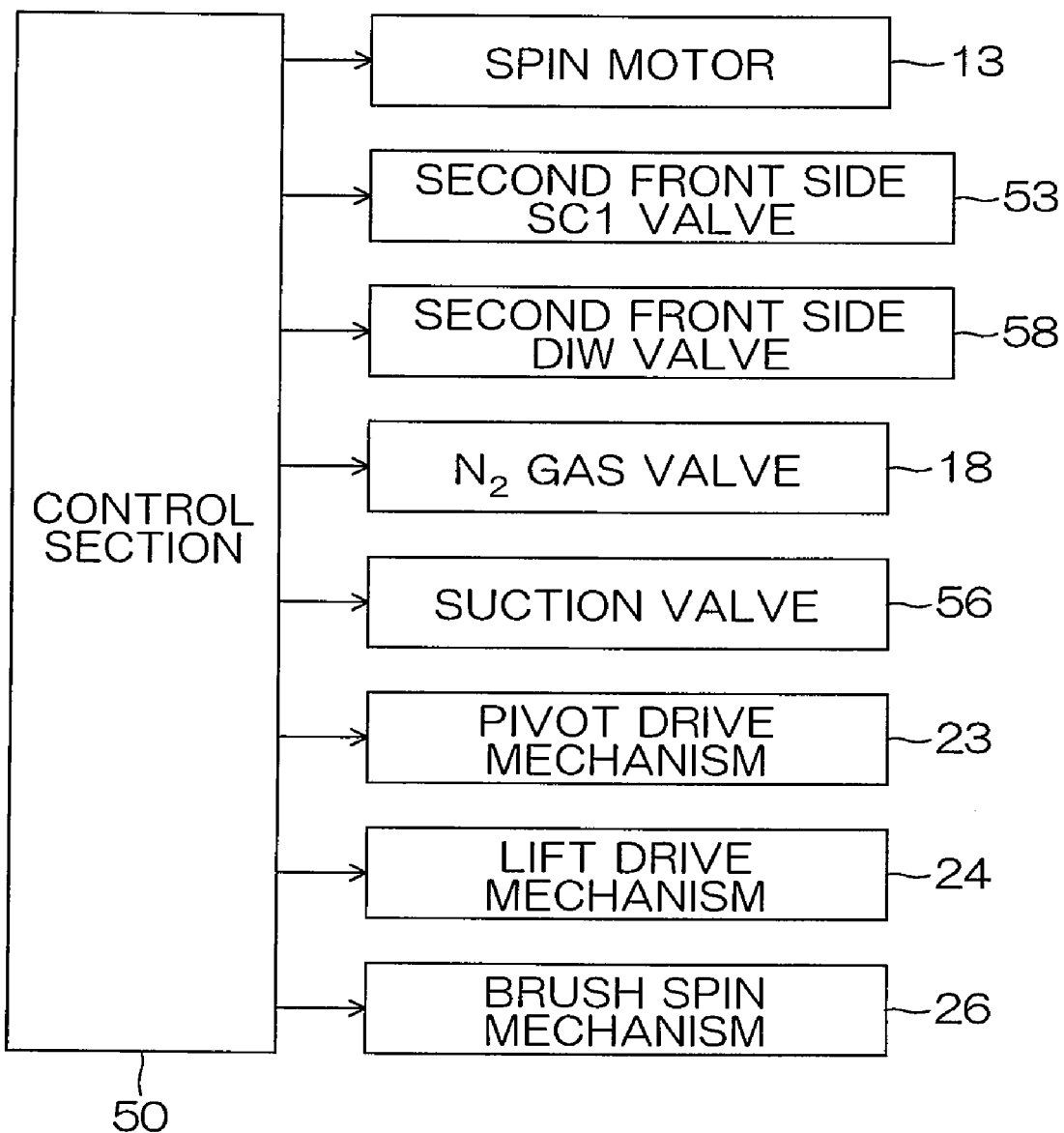
FIG. 8 is a block diagram for explaining the electrical construction of the substrate treatment apparatus shown in FIG. 6.

FIG. 8 is a block diagram for explaining the electrical construction of the substrate treatment apparatus 51.

The spin motor 13, the second front side SC1 valve 53, the second front side DIW valve 58, the $N_2$ gas valve 18, the suction valve 56, the pivot drive mechanism 23, the lift drive mechanism 24 and the brush spin mechanism 26 are connected as control objects to the control section 50.

Figure 9:
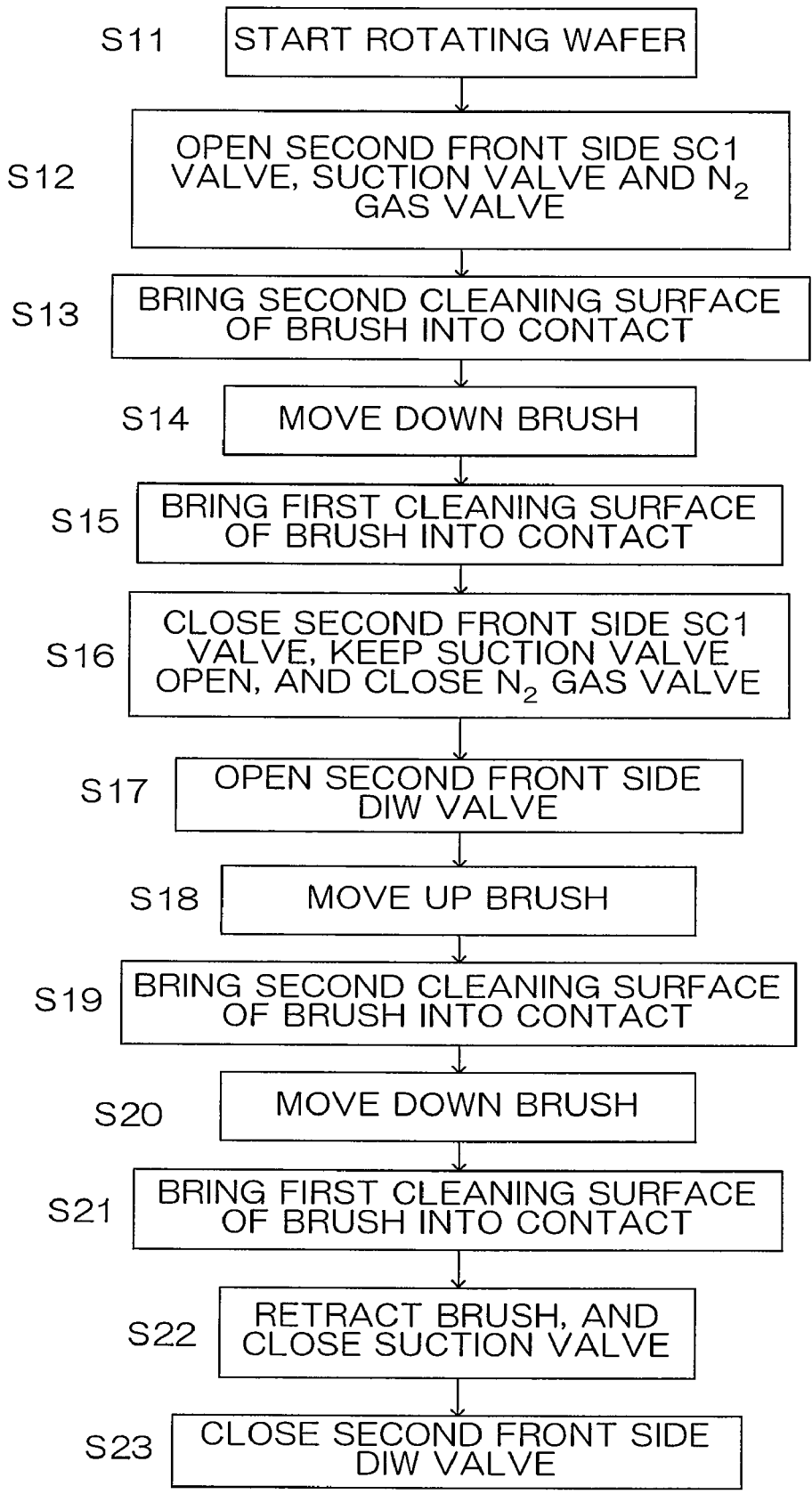
FIG. 9 is a process diagram for explaining a wafer treatment process to be performed by the substrate treatment apparatus shown in FIG. 6.

FIG. 9 is a process diagram for explaining a wafer treatment process to be performed by the substrate treatment apparatus 51. A process for cleaning a wafer W having a low-k film (hydrophobic film) formed on a center portion (device formation region) of a front surface thereof will hereinafter be described by way of example as in the first embodiment.

The wafer W is transported into the substrate treatment apparatus 51, and then held on the spin chuck 3 with its front surface up.

After the wafer W is held on the spin chuck 3, the control section 50 controls the spin motor 13 to cause the spin chuck 3 to start rotating the wafer W (Step S11). The wafer W is rotated, for example, at a rotation speed of 100 rpm.

In turn, the control section 50 opens the second front side SC1 valve 53 (Step S12). Thus, the SC1 is ejected from the second front side SC1 nozzle 52 toward the SC1 applying position P5 on the peripheral edge portion 40 of the front surface of the wafer W (Step S12). The SC1 is ejected, for example, at a flow rate of 20 mL/min from the second front side SC1 nozzle 52. The SC1 to be supplied to the peripheral edge portion 40 of the front surface of the wafer W has a vector directed radially outward from a radially inward side along the rotation radius of the wafer W as seen in plan.

Further, the control section 50 opens the suction valve 56 (Step S12).

Further, the control section 50 opens the $N_2$ gas valve 18 to eject the $N_2$ gas from the $N_2$ gas nozzle 10 toward the $N_2$ gas applying position P4 on the peripheral edge portion 40 of the front surface of the wafer W (Step S12). The $N_2$ gas is ejected, for example, at a flow rate of 5 L/min from the $N_2$ gas nozzle 10.

Then, the control section 50 controls the brush spin mechanism 26 to rotate the brush 21, for example, at a rotation speed of 100 to 200 rpm in the same direction as the wafer rotation direction. Thereafter, the control section 50 controls the pivot drive mechanism 23 and the lift drive mechanism 24 to bring the second cleaning surface 33 of the brush 21 into contact with the peripheral surface 42 and the peripheral edge portion 41 of the back surface of the wafer W (Step S13) to clean the peripheral surface 42 and the peripheral edge portion 41 of the back surface of the wafer W. Step S13 is performed in the same manner as Step S3 in FIG. 5.

After a lapse of a predetermined period from time at which the second cleaning surface 33 of the brush 21 is brought into contact with the wafer W, the control section 50 controls the lift drive mechanism 24 to move down the brush 21 to a predetermined height level (Step S14). Thus, the second cleaning surface 33 of the brush 21 is brought out of contact with the wafer W, and the periphery of the wafer W is brought into contact with the first cleaning surface 32 of the brush 21. Thus, the wafer W squeezes into the first cleaning surface 32 (Step S15: contact with the first cleaning surface of the brush), so that the first cleaning surface 32 is depressed by the peripheral surface 42 and the peripheral edge portion 40 of the front surface of the wafer W. In this state, the supply of the SC1 from the second front side SC1 nozzle 52 is continued. The SC1 applied to the SC1 applying position P5 on the peripheral edge portion 40 of the front surface of the wafer W receives a centrifugal force generated by the rotation of the wafer W to flow radially outward with respect to the rotation radius of the wafer W on the peripheral edge portion 40 of the front surface, so that the brush 21 in contact with the periphery of the wafer W is supplied with the SC1. Thus, the peripheral surface 42 and the peripheral edge portion 40 of the front surface of the wafer W are cleaned by the brush 21 supplied with the SC1, whereby contaminants are scraped from the peripheral surface 42 and the peripheral edge portion 40 of the front surface of the wafer W.

In this state, the suction of the SC1 through the suction nozzle 54 is continued. That is, the SC1 is supplied from the second front side SC1 nozzle 52 to the brush 21, while the SC1 is sucked from the brush 21 through the suction nozzle 54.

The brush 21 is kept impregnated with a necessary and sufficient amount of the SC1, because the SC1 is supplied to brush 21 while being sucked from the brush 21 through the suction nozzle 54. Therefore, a film of the SC1 having a proper wet width (e.g., 2 mm) is formed at the brush contact position P1 on the periphery of wafer W in contact with the brush 21.

Further, the $N_2$ gas is ejected toward the SC1 supplied to the peripheral edge portion 40 of the front surface of the wafer W from the $N_2$ gas nozzle 10 located on a radially inward side with respect to the rotation radius of the wafer W. Thus, the SC1 is forced radially outward with respect to the rotation radius of the wafer W to be thereby quickly removed from the peripheral edge portion 40 of the front surface of the wafer W without remaining on the peripheral edge portion 40.

After a lapse of a predetermined period from time at which the first cleaning surface 32 of the brush 21 is brought into contact with the wafer W, the control section 50 closes the second front side SC1 valve 53 to stop the supply of the SC1 from the second front side SC1 nozzle 52 (Step S16). The suction valve 56 is kept open by the control section 50 to continue the suction of the SC1 through the suction nozzle 54 (Step S16). Further, the control section 50 closes the $N_2$ gas valve 18 to stop the supply of the $N_2$ gas from the $N_2$ gas nozzle 10 (Step S16).

Thereafter, the control section 50 opens the second front side DIW valve 58 (Step S17). Thus, the DIW is ejected from the second front side DIW nozzle 57 toward the DIW applying position P6 on the peripheral edge portion 40 of the front surface of the wafer W. The DIW is ejected, for example, at a flow rate of 10 mL/min from the second front side DIW nozzle 57. The DIW to be supplied to the peripheral edge portion 40 of the front surface of the wafer W has a vector directed radially outward from a radially inward side along the rotation radius of the wafer W as seen in plan. Further, the centrifugal force generated by the rotation of the wafer W acts on the DIW supplied to the peripheral edge portion 40 of the front surface of the wafer W. Therefore, most of the DIW ejected to the DIW applying position P6 is spun out of the wafer W. However, the DIW partly remains on the peripheral edge portion 40 of the front surface of the wafer W.

Further, the control section 50 controls the lift drive mechanism 24 to move up the brush 21 to a predetermined height level (Step S18). Thus, the first cleaning surface 32 of the brush 21 is brought out of the wafer W, and the periphery of the wafer W is brought into contact with the second cleaning surface 33 of the brush 21. Thus, the wafer W squeezes into the second cleaning surface 33 (Step S19: contact with the second cleaning surface of the brush), so that the second cleaning surface 33 is depressed by the peripheral surface 42 and the peripheral edge portion 41 of the back surface of the wafer W. In this state, the DIW remaining on the peripheral edge portion 40 of the front surface of the wafer W is supplied into the brush 21 by the rotation of the wafer W. The peripheral surface 42 and the peripheral edge portion 41 of the back surface of the wafer W are cleaned by the brush 21 supplied with the DIW, whereby the SC1 adhering to the peripheral edge portion 41 of the back surface of the wafer W is washed away.

After a lapse of a predetermined period from time at which the second cleaning surface 33 of the brush 21 is brought into contact with the wafer W, the control section 50 controls the lift drive mechanism 24 to move down the brush 21 to a predetermined height level (Step S20). Thus, the second cleaning surface 33 of the brush 21 is brought out of contact with the wafer W, and the periphery of the wafer W is brought into contact with the first cleaning surface 32 of the brush 21. Thus, the wafer W squeezes into the first cleaning surface 32 (Step S21: contact with the first cleaning surface of the brush), so that the first cleaning surface 32 is depressed by the peripheral surface 42 and the peripheral edge portion 40 of the front surface of the wafer W. In this state, the supply of the DIW from the second front side DIW nozzle 57 is continued. Therefore, the DIW remaining on the peripheral edge portion 40 of the front surface of the wafer W is supplied into the brush 21 by the rotation of the wafer W. Thus, the peripheral surface 42 and the peripheral edge portion 40 of the front surface of the wafer W are cleaned by the brush 21 supplied with the DIW, whereby the SC1 adhering to the peripheral edge portion 40 of the front surface of the wafer W is washed away.

The DIW from the second front side DIW nozzle 57 is supplied to the DIW applying position P6 located downstream of the brush contact position P1 with respect to the wafer rotation direction. The contaminants scraped from the wafer W by the brush 21 are washed away by the DIW supplied from the second front side DIW nozzle 57. Since the DIW is supplied downstream of the brush contact position P1 with respect to the wafer rotation direction, the contaminants scraped from the peripheral edge portion 40 of the front surface are washed away by the DIW.

After a lapse of a predetermined period from time at which the first cleaning surface 32 of the brush 21 is brought into contact with the wafer W, the control section 50 controls the pivot drive mechanism 23 and the lift drive mechanism 24 to retract the brush 21 to the home position at which the brush 21 is located before the start of the treatment process, and closes the suction valve 56 to stop the suction through the suction nozzle 54 (Step S22). When the brush 21 is returned to the home position, the control section 50 controls the brush spin mechanism 26 to stop the rotation of the brush 21. Further, the control section 50 closes the second front side DIW valve 58 to stop the supply of the DIW from the second front side DIW nozzle 57 (Step S23).

Thereafter, the control section 50 controls the spin motor 13 to rotate the wafer W at a high speed (e.g., 3000 rpm). Thus, the DIW adhering to the wafer W is spun off, whereby the wafer W is dried. After the high speed rotation of the wafer W is continued for a predetermined period, the rotation of the wafer W by the spin chuck 3 is stopped. After the wafer W comes to standstill, the cleaned wafer W is transported out of the substrate treatment apparatus 51.

As described above, the brush 21 supplied with the SC1 is brought into contact with the peripheral edge portion 40 of the front surface of the wafer W rotated by the spin chuck 3, whereby the contaminants are scraped from the peripheral edge portion 40. On the other hand, the DIW is supplied from the second front side DIW nozzle 57 to the DIW applying position P6, which is spaced the distance L5 downstream in the wafer rotation direction from the brush contact position P1, on the peripheral edge portion 40 of the front surface of the wafer W. Thus, the contaminants scraped by the brush 21 are washed away by the DIW. Therefore, the contaminants scraped by the brush 21 are prevented from remaining on and adhering to the peripheral edge portion 40 of the front surface of the wafer W.

Since the DIW applying position P6 is spaced the distance L5 downstream in the wafer rotation direction from the brush contact position P1, most of the DIW supplied to the DIW applying position P6 is prevented from directly contacting the brush 21 via the wafer W. Thus, the contaminants washed away by the DIW are substantially prevented from adhering to the brush 21.

The DIW to be supplied to the DIW applying position P6 on the peripheral edge portion 40 of the front surface of the wafer W is ejected from the position located radially inward of the DIW applying position P6 with respect to the rotation radius of the wafer W and, therefore, has a vector directed radially outward with respect to the rotation radius of the wafer W. The centrifugal force generated by the rotation of the wafer W acts on the supplied DIW. Therefore, the DIW supplied to the peripheral edge portion 40 of the front surface of the wafer W is unlikely to flow into the center portion of the front surface of the wafer W. This eliminates the possibility that the device formation region of the front surface of the wafer W is adversely affected by the DIW.

As a result, the contaminants can be advantageously removed from the peripheral edge portion 40 of the front surface of the wafer W without adversely affecting the device formation region of the front surface of the wafer W.

Further, the SC1 from the second front side SC1 nozzle 52 is supplied toward the SC1 applying position P5 located upstream of the brush contact position P1 with respect to the wafer rotation direction on the peripheral edge portion 40 of the front surface of the wafer W rotated by the spin chuck 3. The SC1 supplied onto the peripheral edge portion 40 of the front surface of the wafer W receives the centrifugal force generated by the rotation of the wafer W, and is applied to the brush 21 kept in contact with the periphery of the wafer W. Thus, the SC1 is properly supplied to the brush 21.

Further, the SC1 from the second front side SC1 nozzle 52 is supplied to the rotating brush 21 via the peripheral edge portion 40 of the front surface of the wafer W. Therefore, the scattering of the SC1 due to the rotation of the brush 21 is suppressed as compared with a case in which the SC1 is directly ejected from the second front side SC1 nozzle 52 toward the brush 21.

Furthermore, the brush 21 is impregnated with a necessary and sufficient amount of the SC1, because the SC1 is supplied from the second front side SC1 nozzle 52 to the brush 21 while being sucked from the brush 21 through the suction nozzle 54. Therefore, a film of the chemical agent (SC1) having a proper wet width is formed at the brush contact position P1 on the peripheral edge portion 40 of the front surface of the wafer W. As a result, the peripheral edge portion 40 of the front surface of the wafer W can be advantageously cleaned, while the device formation region of the front surface of the wafer W is prevented from being adversely affected by the SC1.

While the two embodiments of the present invention have thus been described, the invention may be embodied in other ways. For example, the substrate treatment apparatuses 1, 51 may be arranged to supply the SC1 directly to the brush 21. In this case, the SC1 may be supplied to the cleaning surfaces 32, 33 of the brush 21, or may be supplied to the inside of the brush 21 through the brush spin shaft 25.

In the two embodiments described above, the substrate treatment apparatuses 1, 51 are used for cleaning the wafer W having the low-k film (hydrophobic film) formed on the center portion of the front surface thereof by way of example. Alternatively, the substrate treatment apparatuses 1, 51 may be used for cleaning a wafer W having copper interconnections formed on a center portion of a front surface thereof or other types of wafers W.

In the substrate treatment apparatus 1 according to the first embodiment, the suction nozzle for the suction from the brush 21 is not provided. Like the substrate treatment apparatus 51 according to the second embodiment, the substrate treatment apparatus 1 may further include the suction nozzle 54 and the suction pipe 55 for sucking liquid such as the SC1 from the brush 21.

In the treatment process to be performed by the substrate treatment apparatus 1 according to the first embodiment, the brush 21 is retracted to the home position during the rinsing process in Step S8, but may be kept in contact with the periphery of the wafer W during the rinsing process. In this case, the rinsing process is preferably performed by bringing the second cleaning surface 33 of the brush 21 into contact with the peripheral surface 42 and the peripheral edge portion 41 of the back surface of the wafer W, and then bringing the first cleaning surface 32 of the brush 21 into contact with the peripheral surface 42 and the peripheral edge portion 40 of the front surface of the wafer W as in Steps S2 to S7 for the SC1 treatment process.

In the substrate treatment apparatus 51 according to the second embodiment, the back side DIW nozzles 6 may be provided as in the substrate treatment apparatus 1 according to the first embodiment. In this case, the DIW is supplied from the back side DIW nozzles 6 to the brush 21 during the rinsing process in Steps S17 to S22. This eliminates the need for supplying the DIW from the second front side DIW nozzle 57 to the brush 21.

Therefore, the $N_2$ gas may be ejected from the $N_2$ gas nozzle 10 during the rinsing process in Steps S17 to S22. At this time, the $N_2$ gas from the $N_2$ gas nozzle 10 may be ejected from a radially inward side with respect to the rotation radius of the wafer W to the DIW supplied to the peripheral edge portion 40 of the front surface of the wafer W. Thus, the DIW is forced radially outward with respect to the rotation radius of the wafer W to be thereby quickly removed from the peripheral edge portion 40 of the front surface of the wafer W without remaining on the peripheral edge portion 40.

Where the $N_2$ gas is ejected from the $N_2$ gas nozzle 10 in the rinsing process, the contaminants are advantageously removed from the peripheral edge portion 40 of the front surface of the wafer W by ejecting a smaller amount of the DIW from the second front side DIW nozzle 57. By the reduction in the amount of the DIW supplied from the second front side DIW nozzle 57, the DIW scattered from the peripheral edge portion 40 of the front surface of the wafer W is prevented from rebounding onto the front surface of the wafer W.

Further, where the back side DIW nozzles 6 are provided, a sufficient amount of the DIW is supplied to the brush 21 during the rinsing process. Therefore, the suction through the suction nozzle 54 may be effected not only during the SC1 treatment process in Steps S12 to S16 but also during the rinsing process in Steps S17 to S22. In this case, the DIW is prevented from flowing into the center portion of the wafer W.

Although the two embodiments described above are directed to the case in which the rinsing process is performed after the SC1 treatment process, the peripheral edge portion 40 of the front surface of the wafer W may be cleaned with the DIW (rinse liquid) without the use of the SC1 (chemical agent). In this case, a process sequence from Step S12 to Step S16 for the SC1 treatment process may be obviated in the second embodiment.

In this case, the brush 21 supplied with the DIW is brought into contact with the peripheral edge portion 40 of the front surface of the wafer W, whereby the contaminants are scraped from the peripheral edge portion 40. On the other hand, the DIW from the second front side DIW nozzle 57 is supplied to the DIW applying position P6, which is spaced the distance L5 downstream in the wafer rotation direction from the brush contact position P1, on the peripheral edge portion 40 of the front surface of the wafer W. Thus, the contaminants scraped by the brush 21 are immediately washed away by the DIW. Therefore, the contaminants scraped by the brush 21 are prevented from remaining on and adhering to the peripheral edge portion 40 of the front surface of the wafer W.

In the two embodiments described above, the SC1 is used as the chemical agent by way of example, but ammonia water, for example, may be used instead of the SC1.

Further, the rinse liquid is not limited to the DIW, but other examples of the rinse liquid include functional water such as carbonated water, ion water, ozone water, reductive water (hydrogen water) and magnetic water.

In the two embodiments described above, the vacuum suction chuck is used as the spin chuck 3, but the spin chuck 3 is not limited to the vacuum suction chuck. For example, a roller chuck may be used, which is capable of generally horizontally holding the wafer W by holding the peripheral surface 42 of the wafer W by means of a plurality of rollers. In this case, where the chemical agent or the rinse liquid is supplied to the back surface of the wafer W, the supply of the chemical agent or the rinse liquid to the brush 21 is preferably achieved by supplying the chemical agent or the rinse liquid to around the rotation center of the back surface of the wafer W. Where the chemical agent or the rinse liquid is not supplied to the back surface of the wafer W, an edge holding chuck may be used which is capable of generally horizontally holding the wafer W by holding the peripheral surface 42 of the wafer W by means of a plurality of chuck pins.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-194166 filed in the Japanese Patent Office on Jul. 26, 2007, the disclosure of which is incorporated herein by reference.

What is claimed is:

1. A substrate treatment apparatus comprising:
  a substrate rotation unit which rotates a substrate;
  a brush to be brought into contact with at least a peripheral edge portion of a front surface of the substrate rotated by the substrate rotation unit; and
  a peripheral rinse liquid ejection unit which ejects a rinse liquid toward a predetermined rinse liquid applying position on the peripheral edge portion of the front surface of the substrate from a position located radially inward of the predetermined rinse liquid applying position with respect to a rotation radius of the substrate, the predetermined rinse liquid applying position being spaced downstream in a substrate rotation direction from a brush contact area of the peripheral edge portion kept in contact with the brush.

2. A substrate treatment apparatus as set forth in claim 1, further comprising a chemical agent supply unit which supplies a chemical agent to the brush.

3. A substrate treatment apparatus as set forth in claim 2, wherein the chemical agent supply unit ejects the chemical agent toward a predetermined chemical agent applying position on the peripheral edge portion of the front surface of the substrate from a position located radially inward of the predetermined chemical agent applying position with respect to the rotation radius of the substrate, the predetermined chemical agent applying position being located upstream of the brush contact area of the peripheral edge portion with respect to the substrate rotation direction.

4. A substrate treatment apparatus as set forth in claim 2, wherein the substrate rotation unit rotates the substrate about a vertical axis while generally horizontally holding the substrate with the front surface up,
  wherein the chemical agent supply unit supplies the chemical agent to a back surface of the substrate rotated by the substrate rotation unit.

5. A substrate treatment apparatus as set forth in claim 2, further comprising a chemical agent suction unit which sucks the chemical agent from the brush.

6. A substrate treatment apparatus as set forth in claim 2, further comprising a downstream peripheral chemical agent ejection unit which ejects the chemical agent toward a predetermined chemical agent applying position on the peripheral edge portion of the front surface of the substrate from a position located radially inward of the predetermined chemical agent applying position with respect to the rotation radius of the substrate, the predetermined chemical agent applying position being spaced downstream in the substrate rotation direction from the brush contact area of the peripheral edge portion.

7. A substrate treatment apparatus as set forth in claim 1, further comprising a gas ejection unit which ejects an inert gas toward the rinse liquid supplied to the peripheral edge portion of the front surface of the substrate from the peripheral rinse liquid ejection unit at a gas applying position from a position located radially inward of the gas applying position with respect to the rotation radius of the substrate, the gas applying position being spaced downstream in the substrate rotation direction from the predetermined rinse liquid applying position.

8. A substrate treatment apparatus as set forth in claim 1, wherein the brush is made of an elastically deformable material, and has a first cleaning surface having a shape tapered toward one edge thereof in one direction perpendicular to the front surface of the substrate rotated by the substrate rotation unit.

9. A substrate treatment apparatus as set forth in claim 8, wherein the brush further has a second cleaning surface having a shape flared from the one edge of the first cleaning surface in the one perpendicular direction.

10. A substrate treatment apparatus as set forth in claim 1, wherein the chemical agent is an ammonia-hydrogen peroxide mixture.

* * * * *